United States Patent
Wang et al.

(10) Patent No.: US 6,400,220 B1
(45) Date of Patent: Jun. 4, 2002

(54) AUTOTRACKING FEEDBACK CIRCUIT AND HIGH SPEED A/D CONVERTER USING SAME

(75) Inventors: Chien Kuo Wang; Chung Chin Huang, both of Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/716,353

(22) Filed: Nov. 20, 2000

(51) Int. Cl.[7] ................................................. H03F 1/02
(52) U.S. Cl. ............................ 330/9; 330/258; 341/155
(58) Field of Search ...................... 330/9, 258; 341/155

(56) References Cited

U.S. PATENT DOCUMENTS

| | | | | |
|---|---|---|---|---|
| 5,864,257 A | * | 1/1999 | Rothenberg | 330/253 |
| 6,064,262 A | * | 5/2000 | Wang | 330/253 |
| 6,191,648 B1 | * | 2/2001 | Lewicki | 330/9 |

* cited by examiner

Primary Examiner—Michael B Shingleton
(74) Attorney, Agent, or Firm—Mark A. Haynes; Haynes Beffel & Wolfeld LLP (57) ABSTRACT

A bias circuit produces a common mode bias voltage that relies upon active, auto tracking feedback responsive to the reference voltage, such as analog ground, and to the common mode bias voltage to generate a common mode voltage for a differential amplifier. The bias circuit supports high-speed operation, and is stable with variations in temperature, manufacturing processes, and with shifts in the supply voltages. In one embodiment, the bias circuit comprises an operational amplifier and a feedback amplifier that has a common mode bias terminal coupled to the output of the operational amplifier and arranged in a feedback loop with the operational amplifier. The output of the operational amplifier is used as a common mode bias voltage for a differential amplifier. The feedback amplifier is designed to match the differential amplifier for which the common mode bias voltage is being generated, and therefore produces a common mode bias voltage that automatically produces a common mode voltage for the differential amplifier that causes proper settling. A differential amplifier and a high speed analog to digital converter utilize the autotracking, active bias circuit.

23 Claims, 5 Drawing Sheets

AUTOTRACKING FEEDBACK CIRCUIT AND HIGH SPEED A/D CONVERTER USING SAME

BACKGROUND OF THE INVENTION

1. Field of the Invention

The present invention relates to common mode feedback circuits for high gain differential amplifiers, such as operational amplifiers, and to high-speed analog to digital converters utilizing such amplifiers, in which common mode feedback is important for accurate results.

2. Description of Related Art

Pipelined analog to digital converters are commonly used for high-speed applications. Prior art converters of this type can be seen in U.S. Pat. Nos. 4,894,657; 4,903,026; 5,635,937; 5,929,796; 6,028,546; and in many other patents. The basic operation of this type of analog to digital converter involves providing multiple stages, each having a sample and hold amplifier (often a differential operational amplifier), a summing node, and an interstage amplifier (often a differential operational amplifier), which operate in a pipelined fashion, having a sampling mode and an amplifying mode. The first stage samples and holds an input voltage during the sampling mode, and supplies it to a single bit converter during the amplifying mode, which converts the input voltage to a single bit. The single bit is then translated to an analog voltage which is subtracted from the output of the sample and hold amplifier. The interstage amplifier amplifies the resulting difference, and drives it to the next stage during the amplifying mode. Each stage operates in similar manner to produce a number of bits of digital data which represent the input voltage.

One problem associated with pipelined analog to digital converters arises because of the need for biasing the differential operational amplifiers so that they return to a reference voltage, referred to as the analog ground voltage level, or "settle," within a small amount of time. For high speed analog to digital converters operating for example near 160 MHz, the settling time may be on the order of a few nanoseconds. So during the sampling mode, the amplifiers are operated in an offset canceling fashion, so that the output during amplifying mode accurately tracks the input. Common mode feedback circuits have been developed to improve the offset canceling function of the amplifier. Such common mode feedback circuits are also used with a variety of other circuits that use differential amplifiers and operational amplifiers. See U.S. Pat. Nos. 5,955,922 and 5,847,601.

Thus, for a high-speed circuit, is necessary to design an operational amplifier to be used as a sample and hold amplifier, and as an interstage amplifier with high bandwidth, such as in the GHz range, for a 160 MHz clock rate analog to digital converter. Such a high bandwidth typically consumes significant bias current in the operational amplifier. Similarly, the common mode feedback topology must have fast settling characteristics. Within the short settling time, e.g. 3 ns, the outputs of the operational amplifier need to settle to the exact voltage level of analog ground. Any residue in the output voltage will be propagated to a following stage as error voltage that is amplified in subsequent pipeline stages. Also for different speed applications, the common mode feedback circuits must adjust or track the common mode bias voltage necessary to achieve the settling function.

The common mode feedback circuit generates a common mode voltage used for biasing an operating point in the differential amplifier for which the feedback is used. The common mode feedback circuit tends to generate a common mode voltage, which when applied at the biasing point causes the output of the differential amplifier to settle at the analog ground voltage, when the inputs to the differential amplifier are both at the same voltage level (e.g. at analog ground voltage level). The common mode feedback circuits rely on generation of a common mode bias voltage which has a stable value. However, it is difficult provide a common mode bias voltage which is stable over a range of temperatures, manufacturing variations, and variations in the supply voltages on the circuit, and is suitable for high speed operation.

It is desirable to provide a bias circuit for producing the common mode bias voltage that remains stable and accurate independent of temperature, process variations and variations in the supply potential. Furthermore, is desirable that the such bias voltage be generated in a manner that supports high-speed operation of the differential amplifiers utilizing the voltage. Also, is desirable this such bias circuit be suitable for use in high-speed analog to digital converters, and other applications of high gain, differential operational amplifiers.

SUMMARY OF THE INVENTION

The present invention provides a bias circuit for producing a common mode bias voltage that relies upon active, auto tracking feedback responsive to the reference voltage, such as analog ground, and to the common mode voltage to maintain a common mode voltage for establishing analog ground on the output of a differential amplifier. The bias circuit supports high-speed operation, and is stable with variations in temperature, manufacturing processes, and shifts in the supply voltages. In one embodiment, the bias circuit comprises an operational amplifier having a common mode bias terminal coupled to the common mode voltage, and feedback amplifier that has a common mode bias terminal coupled to the output of the operational amplifier and arranged in a feedback loop with the operational amplifier. The output of the operational amplifier is used as a common mode bias voltage for the common mode feedback circuit of a differential amplifier. The feedback amplifier is designed to match the differential amplifier for which the common mode bias voltage is being used, and therefore produces a common mode bias voltage that automatically produces a common mode voltage for the differential amplifier that causes proper settling.

In one embodiment, the feedback amplifier comprises a "half" operational amplifier. In this manner, the feedback amplifier can be designed to match closely a differential operational amplifier for which the common mode bias voltage is being produced.

In another embodiment, the operational amplifier in the feedback circuit is configured as a virtual short, with the output of feedback amplifier and the reference voltage supplied to its inputs. Thus, the feedback amplifier is biased to generate the reference voltage at its output, and a common mode bias voltage generated by the operational amplifier and the feedback circuit is driven to a level that causes the proper settling of the differential amplifier to the reference voltage (i.e. analog ground).

In another embodiment, the present invention provides a common mode feedback circuit for a differential operational amplifier having a positive input, a negative input, positive output, a negative output and a common mode voltage input. The common mode feedback circuit comprises a switched capacitor circuit operating in a sampling mode to sample and hold a common mode bias voltage relative to the reference voltage, and operating in an amplifying mode to apply the sampled and held common mode bias voltage across the common mode input and positive and negative outputs of the differential operational amplifier. A bias circuit is included to produce a common mode bias voltage including a second operational amplifier having a common mode bias terminal coupled to the common mode voltage input, and a feedback amplifier having a common mode bias terminal connected to the output of the second operational amplifier, and being arranged in a feedback loop with the second operational amplifier as discussed above.

In yet another embodiment of invention, a high-speed digital to analog converter is provided including multiple stages which include respective sample and hold amplifiers, respective summing nodes and respective interstage amplifiers. In this embodiment, at least one of the sample and hold amplifiers and interstage amplifiers is implemented as a high gain differential amplifier with the common mode feedback circuit described above.

Accordingly, the present invention provides a common mode feedback circuit which stabilizes the common mode voltage of a fully differential operational amplifier which is suitable for use in high speed circuits, such as analog to digital converters. Furthermore, the common mode feedback circuit includes a bias circuit which automatically tracks the differential operational amplifier subject of the common mode feedback. In this manner, a stable, high speed circuit is achieved.

Other aspects and advantages of the present invention will be seen upon review of the figures, the detailed description and claims which follow.

DETAILED DESCRIPTION

Figure 1:
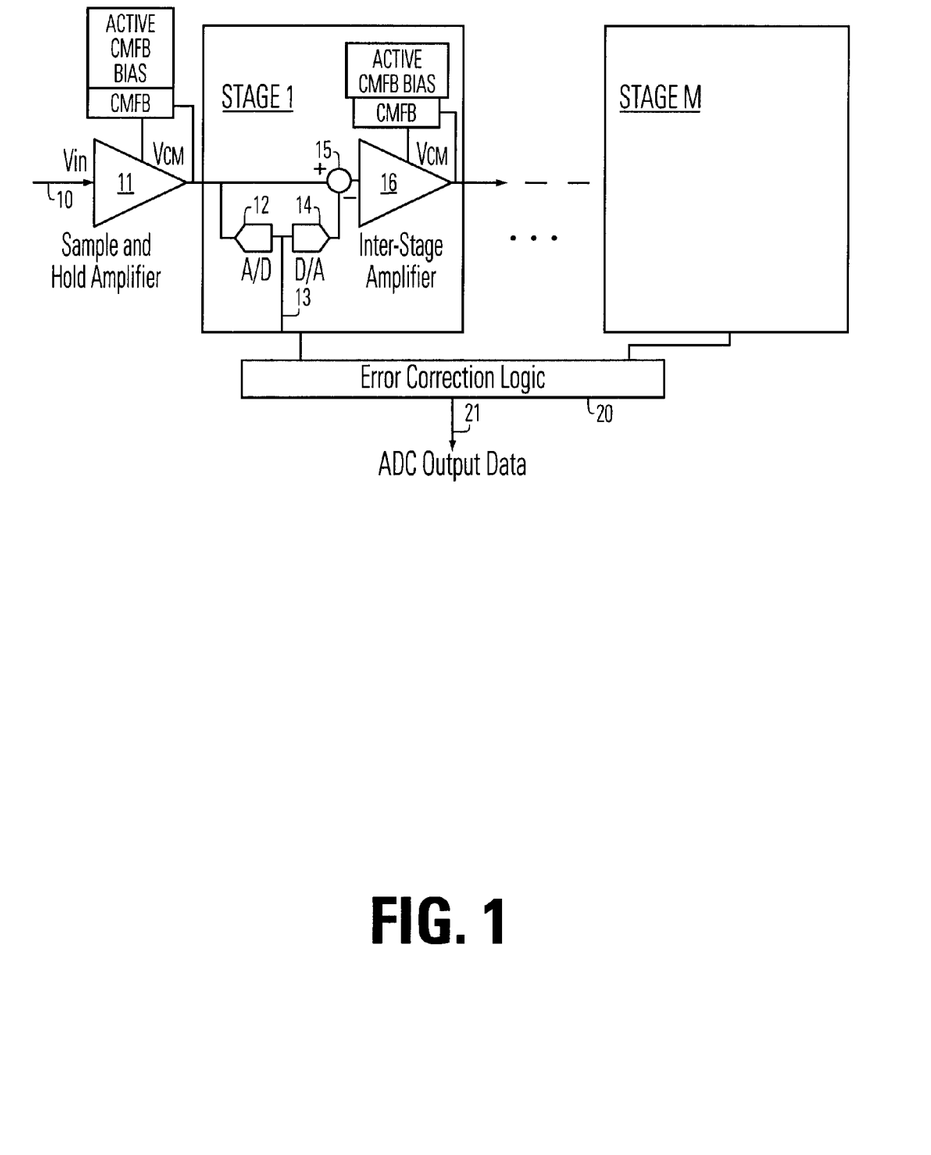
FIG. 1 shows a basic pipelined analog to digital converter having common mode feedback with active common mode feedback bias circuitry according to the present invention.

A detailed description of preferred embodiments of the present invention is provided with respect to FIG. 1 through FIG. 9. FIG. 1 shows a simplified block diagram of a pipelined analog to digital converter which includes the common mode feedback circuit and the active common mode feedback bias circuit according to the present invention.

The pipelined analog to digital converter receives an analog input voltage on line 10 at the input of a sample and hold amplifier 11. The output of the sample and hold amplifier 11 is provided to an analog to digital converter 12 which produces an output bit on line 13. The output bit on line 13 is provided to one-bit digital to analog converter 14, the output of which is supplied to the negative terminal of a summing node 15. The positive terminal of the summing node 15 receives the output of the sample and hold amplifier 11. Thus the difference between the input voltage provided by the sample and hold amplifier 11 and the analog value of the digital signal on line 13 is provided as input to an interstage amplifier 16. The output of interstage amplifier 16 is provided to a subsequent stage in the analog to digital converter, which includes stage 2 (not shown) through stage M. The digital values provided by the stages 1 through M, are provided to error correction logic 20 which provides the output of the pipelined analog to digital controller on line 21.

According to the present invention, the sample and hold amplifier 11 includes a common mode bias terminal which receives a common mode voltage VCM. A common mode feedback circuit 22 is coupled to the output of the sample and hold amplifier 11, and provides the common mode voltage VCM to the amplifier 11. In addition, an active common mode feedback bias circuit 23 produces a common mode feedback bias voltage VCMB, is included which causes automatic tracking of the common mode voltage with variations in temperature, process, operating speed and other factors. In a similar manner, the interstage amplifier 16 includes a common mode feedback circuit 24, with an active common mode feedback bias circuit 25 which provides auto tracking. Utilizing the common mode feedback and active common mode feedback bias according to the present invention, a high-speed and accurate analog to digital converter is implemented. For example, a analog to digital converter operating with a clock speed a 160 MHz is provided in one example.

If the amplifiers used in the pipelined analog to digital convention are sufficiently matched, then a single active common mode feedback bias circuit may be used to produce the common mode feedback bias voltage VCMB for more than one, or all, of the matched amplifiers.

Figure 6:
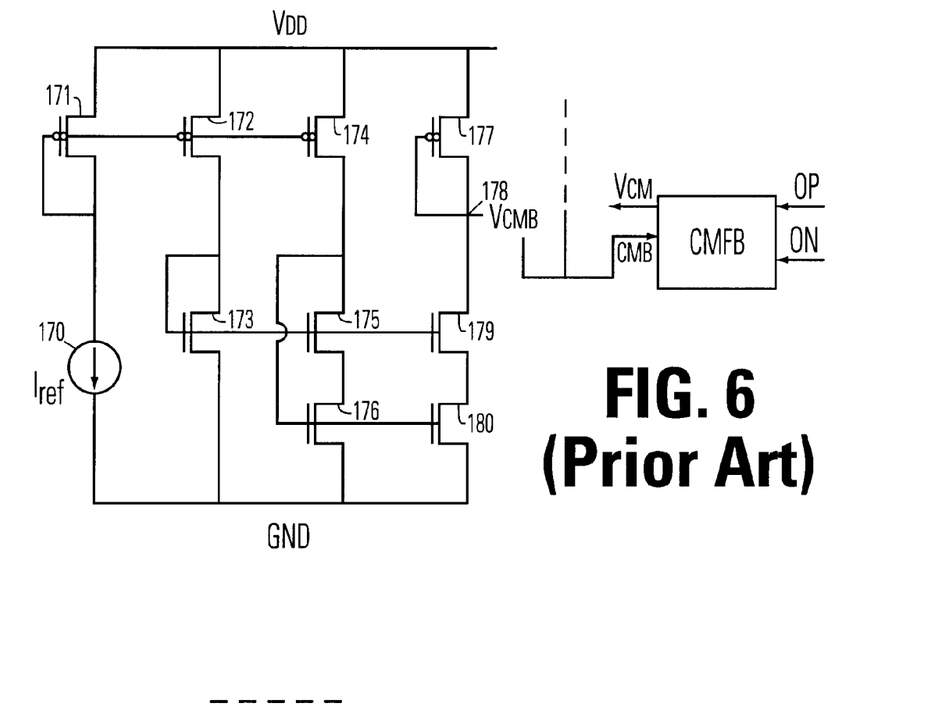
FIG. 6 illustrates a prior art bias circuit for producing the common mode bias voltage.
Figure 7:
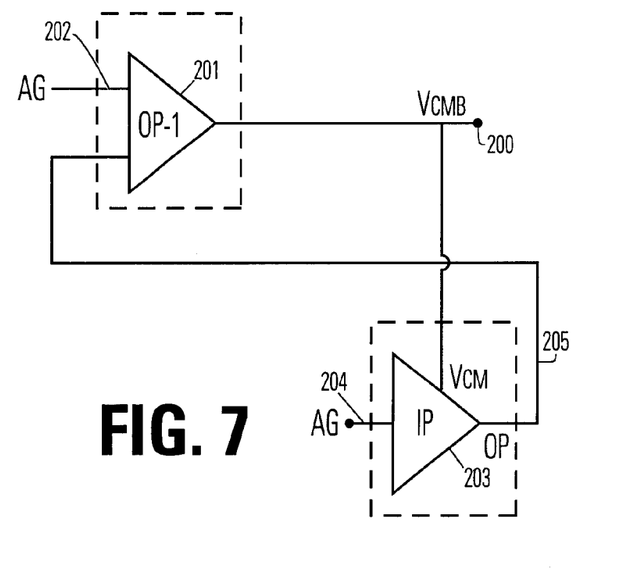
FIG. 7 is a is simplified diagram of the bias circuit according to the present invention using active auto tracking feedback for production of the common mode bias voltage.
Figure 8:
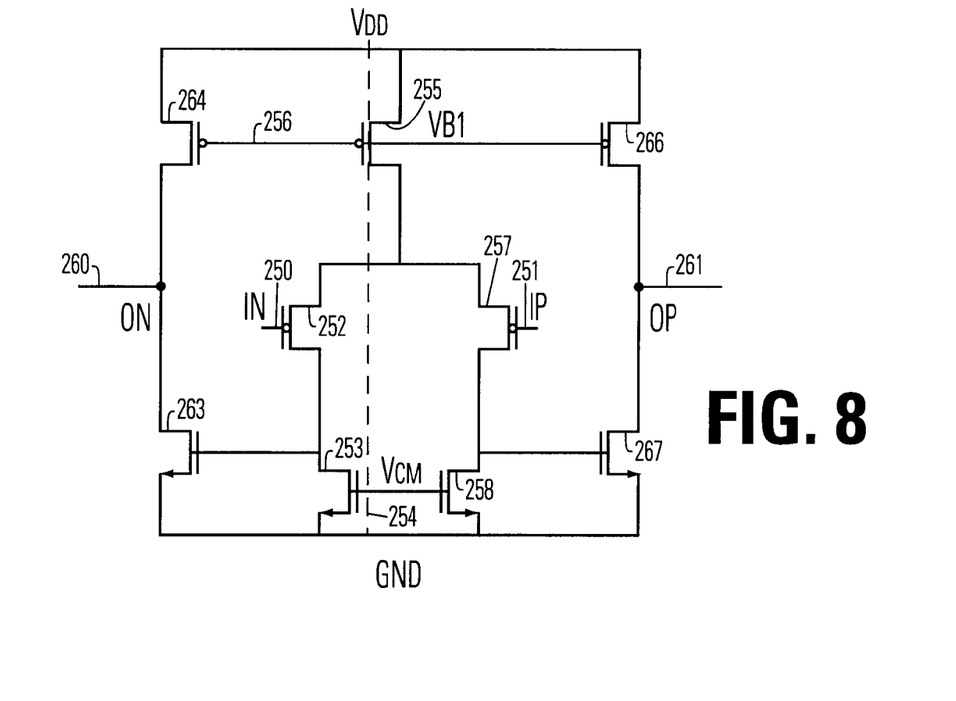
FIG. 8 is a diagram of a sample differential operational amplifier suitable for use in conjunction with the present invention.
Figure 9:
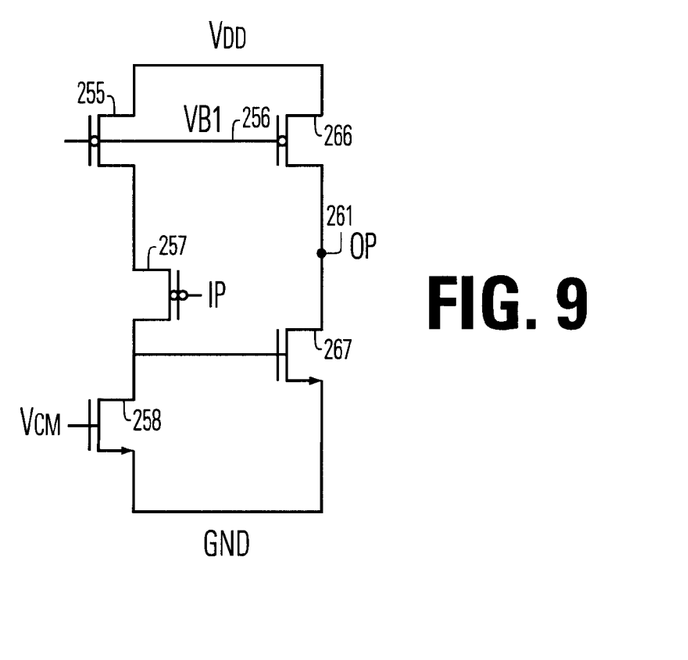
FIG. 9 illustrates an example of a "half" operational amplifier used as a feedback amplifier for the bias circuit of the present invention.

More details of implementation of the analog to digital converter of FIG. 1 are provided with respect to FIGS. 2 through 5. An example common mode feedback bias circuitry of the prior art is shown in FIG. 6, and common mode feedback bias circuitry according to the present invention is shown in FIGS. 7, 8 and 9.

Figure 2:
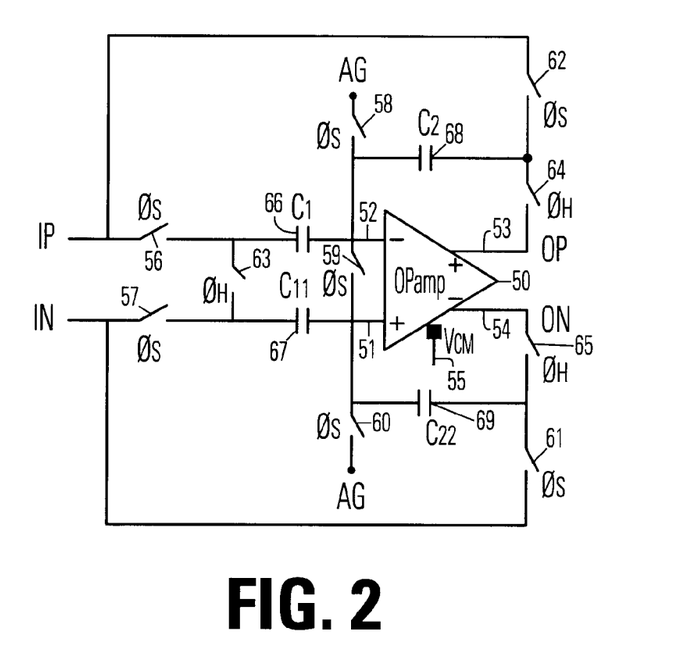
FIG. 2 illustrates a basic design for a sample and hold amplifier for use in the system of FIG. 1, and for which the common mode voltage is generated according to the present invention.

FIG. 2 shows a configuration of a sample and hold amplifier for use in the system of FIG. 1. The configuration includes a high gain, differential amplifier implemented by operational amplifier 50. The operational amplifier 50 includes a positive input 51, a negative input 52, a positive output 53, and a negative output 54. A common mode bias terminal 55 receives a common mode voltage VCM. A first plurality of switches (56–62) is closed during a sampling mode, and a second plurality of switches (63–65) is closed during an amplifying (also called holding) mode. A first input capacitor 66 is coupled between the negative input 52 of the operational amplifier 50 and the switch 56. A second input capacitor 67 is coupled between the positive input 51 of the operational amplifier 50 and the switch 57. A first feedback capacitor 68 is coupled between the negative input 52 of the operational amplifier 50 and the switch 64. A second feedback capacitor 69 is coupled between the positive input 51 of the operational amplifier 50 and the switch 65. An input voltage IP is connected to the switch 56 and the switch 62. An input voltage IN is connected to the switch 57 and the switch 61. The system analog ground is supplied to the switch 58 and the switch 60.

In the sampling mode, the first plurality of switches 56–62 is closed and the second plurality of switches 63–65 is opened. This results in the system analog ground being applied to both the positive input 51 and the negative input 52 of the operational amplifier 50 and to right-hand terminals of the first input capacitor 66 and the second input capacitor 67. The input voltage IP is applied to the left-hand terminal of the first input capacitor 66, and input voltage IN is applied to the left-hand terminal of the second input capacitor 67. Also, the input voltage IP is applied to the right-hand terminal of the first feedback capacitor 68 and the input voltage IN is applied to the right-hand terminal of the second feedback capacitor 69. The left-hand terminals of the first and second feedback capacitors 68 and 69 are coupled to the system analog ground. The common mode voltage VCM is set at a value so that the positive and negative outputs on terminals 53 and 54 return to the system analog ground during the sampling mode.

In the amplifying mode, the first plurality of switches 56–62 is open, and a second plurality of switches 63–64 is closed. This results in the left-hand terminals of the input capacitors 66 and 67 being coupled together, driving the positive and negative inputs 51 and 52 of the operational amplifier 50 to the values of the input voltage IP and input voltage IN. Likewise, the feedback through the first and second feedback capacitors 68 and 69 is established. The positive and negative outputs 53 and 54 of the operational amplifier 50 closely track the inputs with unity gain, or such gains as suits a particular design.

Figure 3:
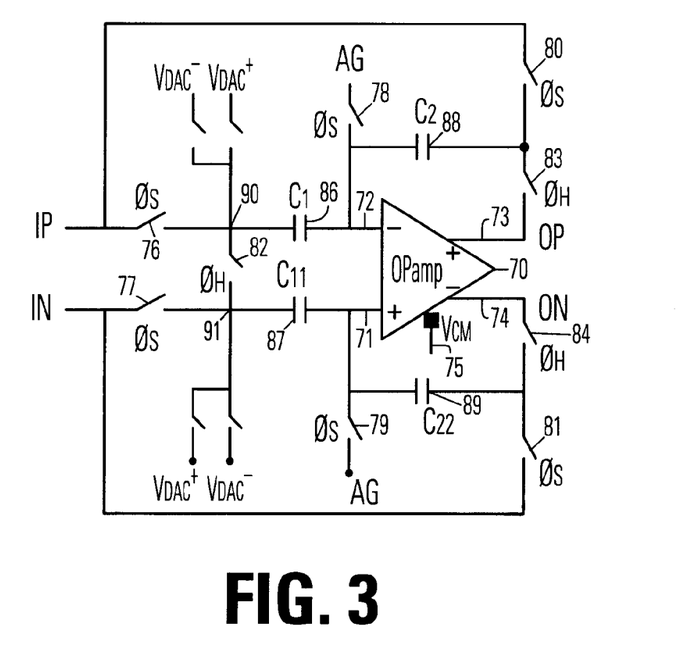
FIG. 3 illustrates a basic design for an interstage amplifier for use in the system of FIG. 1, and for which the common mode voltage is generated according to the present invention.

FIG. 3 shows configuration of the summing node and the interstage amplifier for use in combination with the configuration of FIG. 2. In this example, the interstage amplifier includes a high gain, differential amplifier implemented by an operational amplifier 70. The operational amplifier 70 includes a positive input 71, a negative input 52, a positive output 53, and a negative output 54. A common mode bias terminal 75 receives a common mode voltage VCM. A first plurality of switches (76–81) is closed during the sampling mode, and a second plurality of switches (81–84) is closed during the holding or amplifying mode. A first input capacitor 86 is coupled between the negative input 72 of the operational amplifier 70 and the switch 76. A second input capacitor 87 is coupled between the positive input 71 of the operational amplifier 70 and the switch 77. A first feedback capacitor 88 is coupled between the negative input 72 of the operational amplifier and the switch 83. A second feedback capacitor 89 is coupled between the positive input 71 of the operational amplifier and the switch 84. A summing node 90 and a summing node 91 are included on opposite sides of the switch 82. The summing node 90 is configured to receive the negative reference or the positive reference depending on the value of the analog to digital converter 12 of FIG. 1. The summing node 91 is configured to receive the other of the positive reference and the negative reference depending on the value of the analog to digital converter 12 of FIG. 1.

In the sampling mode, the first plurality of switches 76–81 is closed and the second plurality of switches 82–84 is opened. This results in the sum of the input voltage IP and the output of the digital to analog converter 14 on node 90 to be applied to the left-hand terminal of the input capacitor 86 and the system analog ground to be applied to the right-hand terminal. Also, the sum of the input voltage IN and the output of the digital to analog converter 14 on node 91 is applied to the left-hand terminal of the input capacitor 87, and the system analog ground is applied to the right-hand terminal of the input capacitor 87. Likewise, the input voltage IN is applied to the right-hand terminal of the second feedback capacitor 89, while the input voltage IP supplied to the right-hand terminal of the first feedback capacitor 88. The common mode voltage on terminal 75 is set at a value so that the positive and negative output terminals 73 and 74 of the operational amplifier 70 return to the system analog ground during the sampling mode.

In the amplifying mode, the first plurality of switches 76–81 is opened, and the second plurality of switches 82–84 is closed. This results in the left-hand terminals of the input capacitors 86 and 87 being coupled together, driving the positive and negative inputs 71 and 72 of the operational amplifier 70 to the values of the voltages on the summing nodes 90 and 91. Likewise, the feedback through the first and second feedback capacitors 88 and 89 is established. The positive and negative outputs 73 and 74 of the operational amplifier closely track the voltage on the summing nodes 90 and 91 with unity gain, or such gain as suits a particular implementation.

Figure 4:
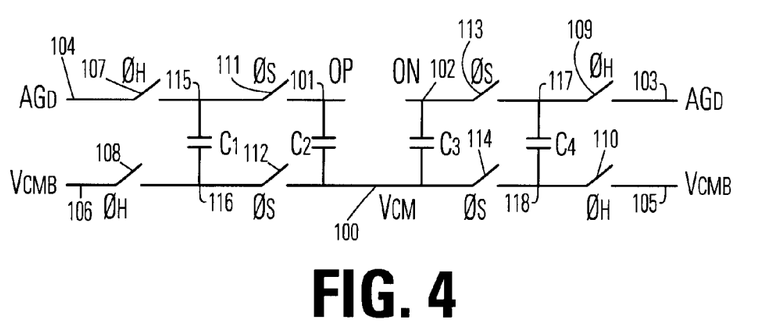
FIG. 4 illustrates a basic common mode feedback circuit producing a common mode voltage in response to a common mode bias voltage.

FIG. 4 shows the basic configuration of a common mode feedback circuit which produces the voltage VCM on node 100 in response to the output voltages OP on node 101 and ON on node 102 of an operational amplifier. The system analog ground AG is applied to nodes 103 and 104 and the common mode bias voltage VCMB is applied to nodes 105 and 106. A first plurality of switches (107–110) is closed during the amplifying mode and a second plurality of switches (111–114) is closed during the sampling mode. The switch 107 is coupled between the node 104 and the top terminal 115 of a capacitor C1. The switch 108 is coupled between the node 106 to the bottom terminal 116 of the capacitor C1. The switch 111 coupled between the node 115 in the node 101. The switch 112 is coupled between the node 116 and the node 100. A capacitor C2 is coupled between the node 101 and node 100. The capacitor C3 is coupled between node 102 and node 100. The switch 113 is coupled between node 102 and the top terminal of a capacitor C4. The switch 114 is coupled between the node 100 and the bottom terminal 118 of the capacitor C4. The switch 109 is coupled between node 107 and the node 103. The switch 110 is coupled between the node 118 and the node 105.

In the amplifying mode, the first plurality of switches 107–110 is closed and the second plurality of switches 111–114 is opened. Thus, the common mode bias voltage VCMB and the analog ground AG are established across the capacitor C1 and the capacitor C4. In the sampling mode, the first plurality of switches 107–110 is open and the second plurality of switches 111–114 is closed. Thus, the voltage across the capacitor C1 is applied across the capacitor C2, and the voltage across the capacitor C4 is applied across the capacitor C3. As described above, in the sampling mode, the common mode voltage VCM is set at a level which causes the outputs OP and ON to settle at the analog ground. During the amplifying mode, the common mode voltage VCM is maintained by the capacitors C2 and C3 at a substantially constant level. The outputs OP and ON are disconnected from the common mode feedback circuit during the amplifying mode.

As can be seen, the level of the common mode bias voltage VCMB must be maintained at a level which causes the outputs of the operational amplifier to settle at the analog ground level AG during the sampling mode. Shifts in the common mode bias voltage VCMB result in offset errors at the outputs which accumulate in pipelined circuits like pipelined analog to digital converters.

Figure 5:
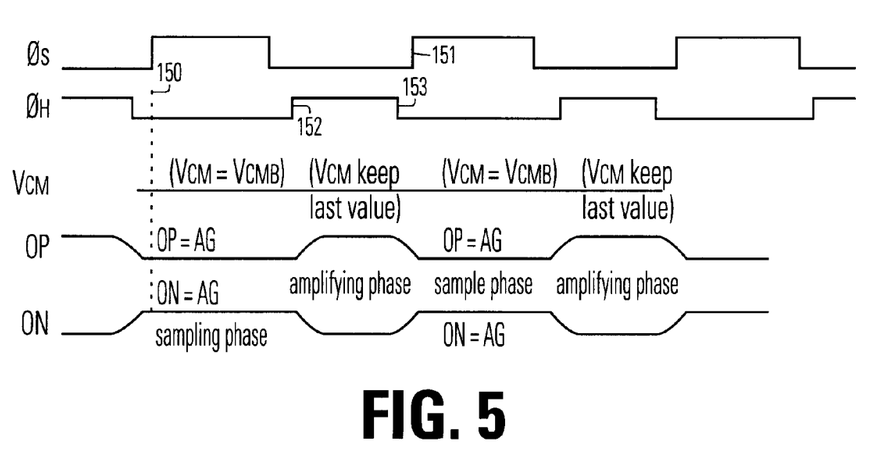
FIG. 5 illustrates the timing of operation of the high-speed analog to digital converter of FIG. 1, showing in the settling operation according to the present invention.

Operation of the circuit can be better understood with reference to the timing diagram in FIG. 5. In FIG. 5, the first trace illustrates the control clock $\emptyset_S$ which causes the switches for the sampling mode to close when it is in a high state. The second trace illustrates the control clock $\emptyset_H$ which causes the switches for the amplifying mode to close when it is in a high state. The third trace illustrates the common mode voltage VCM. The fourth trace illustrates the positive output OP of the operational amplifier. The fifth trace illustrates the negative output ON of the operational amplifier. As can be seen, when the sampling mode switches close at time 150, the common mode voltage is clamped at the common mode bias voltage VCMB, and both the positive output OP and the negative output ON settle at the analog ground level. At time 151, the sampling mode switches open. Shortly thereafter at time 152, the holding mode or amplifying mode switches close and the positive output OP goes high, and the negative output ON goes low depending on the input voltages. At time 153, the holding mode switches open and a short time later at time 154 the sampling mode switches close. When the sampling mode switches close, the outputs OP and ON settle at the analog ground once again, and the cycle repeats. The common mode voltage VCM is set at the common mode bias voltage VCMB during the time in which the sampling mode switches are closed and maintains its last value during the time in which the holding or amplifying mode switches are closed. Thus, it can be seen that changes in the common mode bias voltage VCMB can result in drift of the level to which the outputs settle during the sampling phases. Such drift results in errors in operation of the circuitry relying on the accuracy of the operational amplifiers.

FIG. 6 illustrates one example circuit for producing a common mode bias voltage VCMB, according to the prior art. The circuit is based on a reference current source 170 which drives the diode connected p-channel transistor 171 having its source coupled to the supply potential VDD. A second leg of the circuit includes a p-channel transistor 172 connected in current mirror configuration with the transistor 171, and an n-channel transistor 173 in series between the transistor 172 and ground, and connected in a diode configuration. The third leg of the circuit includes p-channel transistor 174 connected in current mirror configuration with the transistors 171 and 172, and series connected n-channel transistors 175 and 176 between the p-channel transistor 174 and ground. The transistor 175 has its drain connected to the drain of the p-channel transistor 174. The gate of the n-channel transistor 175 is connect to the gate of the n-channel transistor 173. The gate of the n-channel transistor 176 is coupled to the drain of the n-channel transistor 175. The fourth leg of the circuit includes a p-channel transistor 177 connected in a diode configuration, with its source coupled to the supply potential VDD and its drain and gate coupled to the output node 178, on which the common mode bias voltage VCMB is produced. N-channel transistors 179 and 180 are coupled in series between the node 178 and ground. The gate of transistor 179 is connected to the gates of transistors 173 and 175. The gate of transistor 180 is connected to the gate of transistor 176. In this manner, a common mode bias voltage VCMB is produced on the node 178 which has a value basically established by the reference current source 170. However, the circuit does not track variations in temperature nor, variations in manufacturing processes as well as needed for high speed circuits. Further, to change the operating speed on the device, the reference current source must be adjusted to prevent unwanted shifts in VCMB.

FIG. 7 provides a simplified diagram of the common mode bias voltage circuit according to present invention, which produces the common mode bias voltage VCMB on node 200. The node 200 is the positive output of a high gain amplifier 201, such as a first operational amplifier. The first input to the amplifier 201 is connected to the analog ground AG. The second input of the amplifier 201 is coupled to the output of a second amplifier 203 configured in a feedback loop. The amplifier 201 may be an operational amplifier or other type of amplifier. The feedback amplifier 203 has the analog ground AG on its input, and is configured for producing output 205. The amplifier 201 produces the output on node 200. The feedback amplifier 203 is responsive to a common mode voltage, which is supplied by the output 200 of the amplifier 201, so that the common mode bias voltage VCMB is used as the common mode voltage for the feedback amplifier 203. Feedback amplifier 203 is made to match the characteristics (e.g., amplifier configuration, device aspect ratios) of the differential amplifier which is to receive the common mode feedback for which the common mode bias voltage is being produced. The amplifier 201 is connected in a virtual short configuration. Thus, the circuit tends to drive the signal on node 205 to the same value, analog ground, as applied on node 202. The variable voltage in the circuit is the common mode bias voltage VCMB on node 200 which is applied to the feedback amplifier 203 as a common mode voltage.

In a preferred embodiment, the feedback amplifier 203 is implemented as a "half" operational amplifier matching the positive output portions of an operational amplifier which is to receive the common mode feedback for which the common mode bias voltage VCMB is produced, such as the sample and hold amplifier 11 and the interstage amplifier 16 in the circuit of FIG. 1. If a design change results in different tail currents for high speed operation in the amplifiers being biased, then the amplifier 203 in the common mode bias circuit feedback loop, is also changed in the same manufacturing process. This allows the common mode bias voltage to track changes in temperature, changes in manufacturing process, and changes in speed of operation of the subject operational amplifier. Furthermore, the feedback is active, automatically tracking such variations rapidly and consistently, allowing high speed and accurate operation of circuits like pipelined analog to digital converters.

FIGS. 8 and 9 show a basic operational amplifier and "half" operational amplifier, respectively, suitable for use in the circuit of FIG. 7. The operational amplifier shown in FIG. 8 includes a negative input stage, receiving negative input voltage IN on node 250, and a positive input stage which receives the positive input IP on the node 251. The negative input stage includes p-channel transistor 252 in series with n-channel current source transistor 253. The common mode voltage VCM is applied to the gate of the transistor 253 at the node 254. A p-channel, load current source transistor 255 is connected between the source of the p-channel transistor 252 and the supply potential VDD. A bias voltage VB1 is connected on line 256 to the gate of the transistor 255. The positive input stage includes p-channel transistor 257 having a source coupled to the drain of the transistor 255, and a drain coupled to the drain of n-channel current source transistor 258. The gate of transistor 258 receives the common mode voltage on line 254. A negative output stage produces the output signal ON on node 260. A positive output stage produces the output voltage OP on node 261. The negative output stage includes the n-channel transistor 263 in series with the p-channel transistor 264. The p-channel transistor 264 has its source coupled to the supply potential VDD and its drain coupled to the node 260. The n-channel transistor 263 has its drain coupled to the node 260 and its source coupled to ground. The gate of the transistor 263 is coupled to the node at the drain of the transistor 253. The gate of the transistor 264 is coupled to the bias voltage on node 256. The positive output stage includes the p-channel transistor 266 having its gate coupled to the bias voltage VB1 on node 256, its source coupled to the supply potential VDD, and its drain coupled to the node 261. The positive output stage also includes the n-channel transistor 267 which has its drain coupled to the node 261, its gate coupled to the drain of the transistor 258, and its source coupled ground.

The operational amplifier in FIG. 8 is a basic circuit which amplifies differences between inputs IN on node 250 and IP on node 251 to produce the differential outputs on nodes 260 and 261. There is a common mode voltage VCM which causes the outputs OP and ON to settle on the value of a reference voltage, such as analog ground for a high speed pipelined analog to digital converter, when both IN and IP are set at that same reference voltage. The common mode feedback bias circuit tends to establish that value. The active common mode feedback bias circuit of the present mention automatically tracks variations in operation the operational amplifier to maintain the common mode voltage at a level which maintains a stable analog ground level.

FIG. 9 shows a "half" operational amplifier suitable for use as the feedback amplifier 203 in the common mode bias circuit of FIG. 7. The components of FIG. 9 which have matching components in FIG. 8, have like reference numbers, and are not described again. This amplifier circuit matches the operational amplifier which is to receive the common mode feedback, so that variations in manufacturing process, temperature and speed operation are tracked automatically in the active feedback of the circuit producing the common mode bias voltage VCMB.

Other operational amplifier architectures and "half" operational amplifier architectures can be utilized in various embodiments of the present invention. The examples provided here are embodiments meant to illustrate one preferred example, and provide guidance for implementation of other similar circuits.

The present invention provides for generation of a common mode feedback bias voltage for operational amplifiers used as sample and hold and as interstage amplifiers in pipelined analog to digital converters, with fast settling of the outputs to the level of analog ground during the sampling modes. The topology can use a "half" operational amplifier in the common mode bias circuit, or full operational amplifiers. Fast settling times achievable by the present invention are important for any circuit requiring fast settling times for differential amplifiers with a common mode bias terminal.

The foregoing description of various embodiments of the invention have been presented for purposes of illustration and description. The description is not intended to limit the invention to the precise forms disclosed. Many modifications and equivalent arrangements will be apparent to people skilled in the art.

What is claimed is:

1. An amplifier stage for a high speed circuit, comprising:
    a differential amplifier having a common mode voltage, and first and second inputs, and at least one output having level affected by the common mode voltage;
    a common mode feedback circuit, coupled to the at least one output, a reference voltage, and a common mode bias voltage to produce the common mode voltage so that the at least one output matches the reference voltage during an interval in which the first and second inputs match the reference voltage; and
    a bias circuit to produce the common mode bias voltage including active feedback responsive to the reference voltage and the common mode bias voltage.

2. The amplifier stage of claim 1, wherein the active feedback comprises:
    a first amplifier; and
    a feedback amplifier having a common mode bias terminal connected to the output of the first amplifier, and being arranged in a feedback loop with the first amplifier.

3. The amplifier stage of claim 1, wherein the reference voltage is analog ground.

4. The amplifier stage of claim 2, wherein the feedback amplifier comprises a half operational amplifier having components matching the differential amplifier.

5. The amplifier stage of claim 2, wherein the first amplifier is configured as a virtual short.

6. The amplifier stage of claim 2, wherein the first amplifier has first and second inputs, the first input coupled to the reference voltage, and the second input coupled to an output of the feedback amplifier, and having an output with a level affected by a common mode voltage, the reference voltage and the output of the feedback amplifier, the output of the first amplifier being the common mode bias voltage, and the feedback amplifier having a first input coupled to the reference voltage, and having an output level affected by the common mode bias voltage and the reference voltage.

7. The amplifier stage of claim 2, wherein said differential amplifier comprises an operational amplifier matching said feedback amplifier in the bias circuit.

8. The amplifier stage of claim 1, wherein the differential amplifier acts as a stage in a pipelined analog to digital converter.

9. The amplifier stage of claim 1, wherein the differential amplifier is configured to act in a sampling mode and in an amplifying mode, and wherein said common mode feedback circuit drives the output of the differential amplifier to the reference voltage during the sampling mode.

10. A common mode feedback circuit for a differential operational amplifier having a positive input, a negative input, a positive output, a negative output, and a common mode voltage input, and operating in a sampling mode during which the positive and negative inputs are coupled to a reference voltage, and an amplifying mode during which the positive and negative inputs are coupled to respective nodes holding a sampled voltage, comprising:
    a switched capacitor circuit operating in the amplifying mode to sample and hold a common mode bias voltage relative to the reference voltage, and in the sampling mode to apply the sampled and held common mode bias voltage across the common mode voltage input and the positive and negative outputs of the differential operational amplifier; and
    a bias circuit to produce the common mode bias voltage including a second operational amplifier having a common mode bias terminal and a feedback amplifier having a common mode bias terminal connected to the output of the second operational amplifier, and being arranged in a feedback loop with the second operational amplifier.

11. The common mode feedback circuit of claim 10, wherein the reference voltage is analog ground.

12. The common mode feedback circuit of claim 10, wherein the feedback amplifier comprises a half operational amplifier having components matching the differential operational amplifier.

13. The common mode feedback circuit of claim 10, wherein the second operational amplifier is configured as a virtual short.

14. The common mode feedback circuit of claim 10, wherein the second operational amplifier has first and second inputs, the first input coupled to the reference voltage, and the second input coupled to an output of the feedback amplifier, and having an output with a level affected by the reference voltage and the output of the feedback amplifier, the output of the second operational amplifier being the common mode bias voltage, and the feedback amplifier having a first input coupled to the reference voltage, and having an output level affected by the common mode bias voltage and the reference voltage.

15. The common mode feedback circuit of claim 10, wherein said common mode feedback circuit drives the positive and negative outputs of the differential operational amplifier to the reference voltage during the sampling mode.

16. A pipelined analog to digital converter, comprising:
    a plurality of converter stages, the converter stages including respective sample and hold amplifiers, respective summing nodes, and respective interstage amplifiers; wherein at least one of the sample and hold amplifiers and said interstage amplifiers comprises:
        a differential amplifier having a common mode voltage, and first and second inputs, and at least one output having level affected by the common mode voltage;
        a common mode feedback circuit, coupled to the at least one output, a reference voltage, and a common mode bias voltage to produce the common mode voltage so that the at least one output matches the reference voltage during an interval in which the first and second inputs match the reference voltage; and
        a bias circuit to produce the common mode bias voltage including active feedback responsive to the reference voltage and the common mode bias voltage.

17. The pipelined analog to digital converter of claim 16, wherein the active feedback comprises:
    an operational amplifier; and
    a feedback amplifier having a common mode bias terminal connected to the output of the operational amplifier, and being arranged in a feedback loop with the operational amplifier.

18. The pipelined analog to digital converter of claim 16, wherein the reference voltage is analog ground.

19. The pipelined analog to digital converter of claim 17, wherein the feedback amplifier comprises a half operational amplifier having components matching the differential amplifier.

20. The pipelined analog to digital converter of claim 17, wherein the operational amplifier is configured as a virtual short.

21. The pipelined analog to digital converter of claim 17, wherein the operational amplifier has first and second inputs, the first input coupled to the reference voltage, and the second input coupled to an output of the feedback amplifier, and having an output with a level affected by the reference voltage and the output of the feedback amplifier, the output of the operational amplifier being the common mode bias voltage, and the feedback amplifier having a first input coupled to the reference voltage, and having an output level affected by the common mode bias voltage and the reference voltage.

22. The pipelined analog to digital converter of claim 17, wherein said differential amplifier comprises an operational amplifier matching said feedback amplifier in the bias circuit.

23. The pipelined analog to digital converter of claim 16, wherein the differential amplifier is configured to act in a sampling mode and in an amplifying mode, and wherein said common mode feedback circuit drives the output of the differential amplifier to the reference voltage during the sampling mode.

* * * * *